United States Patent [19]

Wanlass

[11] 3,997,381
[45] Dec. 14, 1976

[54] METHOD OF MANUFACTURE OF AN EPITAXIAL SEMICONDUCTOR LAYER ON AN INSULATING SUBSTRATE

[75] Inventor: David R. Wanlass, Mountain View, Calif.

[73] Assignee: Intel Corporation, Santa Clara, Calif.

[22] Filed: Jan. 10, 1975

[21] Appl. No.: 540,010

[52] U.S. Cl. .................................. 156/3; 156/7; 156/17; 252/79.3; 252/79.4
[51] Int. Cl.² ...................................... H01L 7/50
[58] Field of Search ............... 156/3, 7, 17, 605; 252/79.3, 79.4; 29/580, 583; 204/129.2

[56] References Cited

UNITED STATES PATENTS

| | | | |
|---|---|---|---|
| 3,536,600 | 10/1970 | VanDijk et al. | 204/129.1 X |
| 3,756,877 | 9/1973 | Murauka et al. | 156/17 |
| 3,776,788 | 12/1973 | Henker | 156/17 |

OTHER PUBLICATIONS

RCA Review, vol. 31, No. 2, 6-1970, A New Technique for Etch Thinning Silicon Wafers by A. I. Stoller, R. F. Speers and S. Opresko, pp. 265–270.

*Primary Examiner*—William A. Powell
*Attorney, Agent, or Firm*—Spensley, Horn & Lubitz

[57] ABSTRACT

A thin epitaxial layer of silicon is disposed on a supporting silicon substrate and a silicon oxide layer or other suitable layer is formed on the epitaxial layer. The substrate, epitaxial layer and oxide layer sandwich is bonded by the simultaneous application of heat and voltaic pressure to another oxidized substrate such that the epitaxial layer is sandwiched between the two substrates with the oxide layer at the sandwich interface. Alternatively, the substrates may be joined by bonding without the use of voltaic pressure by placing the substrates (parent and supporting) at approximately 900° C. The substrates with the epitaxial layer is processed to remove a substantial portion of the silicon substrate with the final portion being removed by etching. When the final portion of the silicon substrate is removed by etching, exposing the epitaxial silicon layer, the etching rate changes dramatically and this is reflected in the byproduct concentration in the etchant solution. The etching process is immediately terminated when the epitaxial layer is fully exposed. After further finishing steps, the resulting product of this method is an epitaxial monocrystalline silicon layer of high crystalline perfection, separated by a silicon oxide layer from a supporting silicon substrate.

5 Claims, 10 Drawing Figures

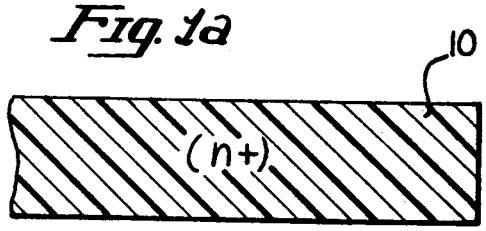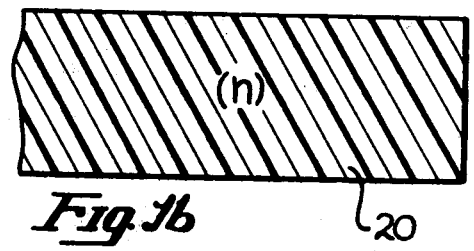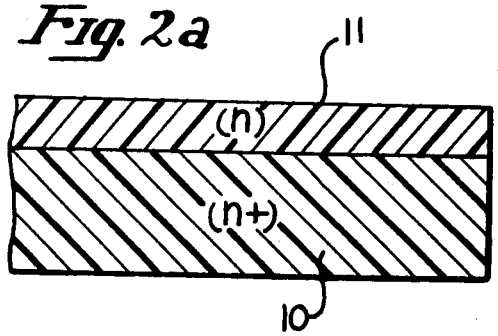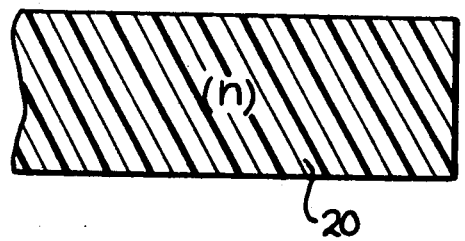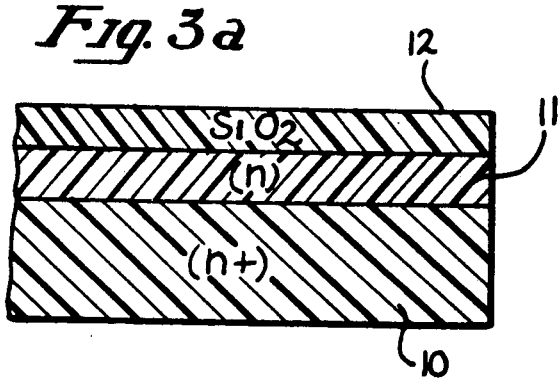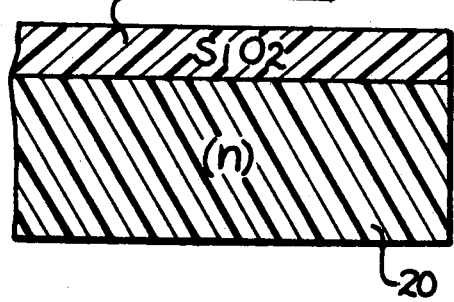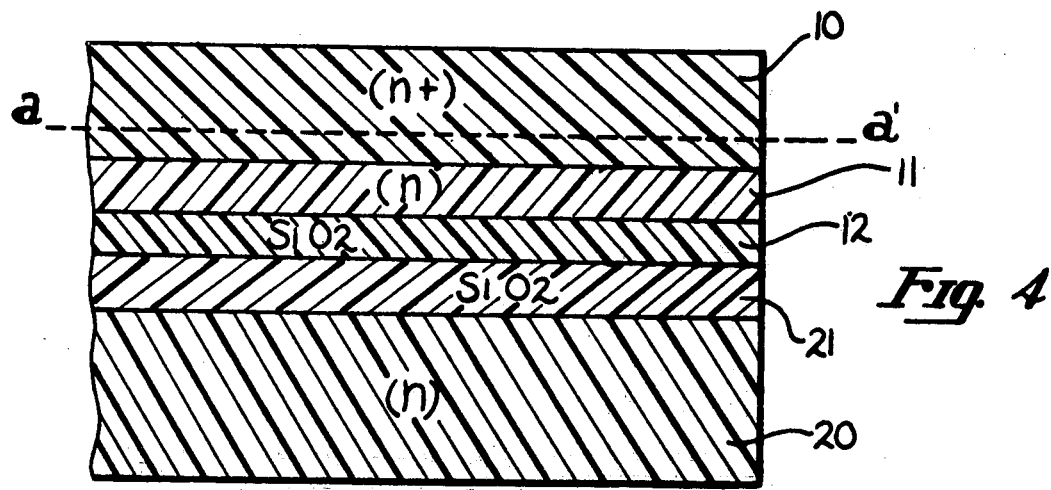

METHOD OF MANUFACTURE OF AN EPITAXIAL SEMICONDUCTOR LAYER ON AN INSULATING SUBSTRATE

BACKGROUND OF THE INVENTION

1. Field of the Invention

The present invention relates to the field of processing semiconductor wafers for subsequent fabrication into semiconductor and integrated circuit devices. More particularly the present invention relates to a method whereby a semiconductor wafer may be prepared in the form of a thin epitaxial crystalline layer formed upon one or more thin insulative layers which in turn are supported on a substrate.

2. Discussion of the Prior Art

There has been an increased interest in the fabrication of devices incorporating thin layers of monocrystalline silicon as the active semiconductor region, i.e., the region wherein the semiconductor devices are formed. These layers are disposed on a supporting substrate — typically an electrical insulator such as sapphire. Such composite wafers have been referred to as SIS wafers or where sapphire is the specific substrate material, SOS wafers. One of the particular interests in SIS wafers has been in regard to lateral devices wherein the diffused regions are formed throughout the entire thickness of the thin monocrystalline film. The diffused regions are placed adjacent to each other in such manner that the resulting junctions are formed in planes which are perpendicular to the plane of semiconductor wafer rather than in a plane parallel to the wafer surface as is substantially the case in standard planar technology. The beneficial result achieved by the use of lateral devices is a decrease in the capacitance of the diffused junctions which results in improved high frequency characteristics. In addition because of the potential for greater densities there is expanded interest in forming MOS or FET devices in SIS substrates by planar technology.

The prior art has developed three basic modes in which such SIS or SOS wafers may be fabricated. The first mode involves the pyrolitic deposition of silicon on a sapphire or spinel substrate. By careful control of the quality of the substrate's surface, a single crystal film of 1 to 10 microns thickness can be grown. The chief disadvantage of silicon films grown on sapphire or spinel substrates has been the poor quality of crystalline perfection usually obtainable in such films. The extent of crystalline imperfection has in fact been so great as to substantially disqualify wafers made by this mode for use in bipolar devices and dynamic MOS devices.

A second mode of fabrication of the prior art involves the use of an anodic dissolution of a parent substrate. More specifically, this mode involves the use of a heavily doped, substrate of silicon upon which an epitaxial layer of less highly doped silicon has been disposed. The epitaxial silicon layer and the underlying parent substrate are then partially oxidized and a thick layer of polycrystalline silicon is then formed upon the oxidized surface. The epitaxial layer of silicon forms the middle of a sandwich between the polycrystalline silicon and the oxidized layer on one side, and the parent substrate on the other side. The final step of this method is then to anodically dissolve the parent substrate. The result is a SIS type structure consisting of a monocrystalline epitaxial layer of silicon on a thin layer of silicon oxide supported in turn by a thick layer of polycrystalline silicon. The crystalline perfection of the epitaxial layer grown by this method is significantly greater than that grown by the method utilizing spinel or sapphire as a parent substrate.

A third method of the prior art has modified the anodically fabricated SIS wafer by substituting a field assisted bonding step in place of the deposition of polycrystalline silicon. More particularly, this third method begins with a substrate of heavily doped monocrystalline silicon upon which an epitaxial layer of less heavily doped silicon has been grown. As in the previous method, the epitaxial layer is then provided with a thermal oxide coating, but in place of the step of depositing polycrystalline silicon described above, a second substrate of monocrystalline silicon, similar to the substrate upon which the epitaxial crystalline layer was grown, is prepared and provided with a thin oxide coating. The oxide coating of the second substrate is then bonded to the oxide coating covering the epitaxial layer. The bonding process utilized is known as field assisted bonding. The field assisted bonding process is well known in the art as that method is employed to bond glass to metal by use of a combination of heat and electrostatic pressure. See G. Wallis and E. I. Pomerantz, 40 *J. Appl. Phys.* 3946 (1969); G. Wallis, 53 *J. Am. Ceram. Soc.* 563 (1970); P. B. DeNee, 40 *J. Appl. Phys.* 5396 (1969). Typically this method involves placing the silicon oxide layers of the two substrates on top of each other and heating them to about 900° C. A voltage of about 100 volts (for 2 microns of oxide) is then applied across the heated wafer and maintained for a few minutes. The combination of the electrostatic force from the applied voltage and the heat produces a bond with a tensile strength between 500–1000 psi. As a general rule the bonding is uniform across the oxide surface provided that the bonded surfaces are smooth, flat and free of pinholes.

The next step in the method utilizing the field assisted bonding process is the removal of the parent substrate upon which the epitaxial layer was grown. Numerous methods exist in the prior art by which the parent substrate may be thinned or removed to expose the epitaxial silicon layer. After removal of the parent layer the resulting structure is an epitaxial layer disposed upon a double layer of silicon oxide which in turn is supported by a thick crystalline substrate. This SIS type wafer has several advantages over the wafer fabricated utilizing polycrystalline silicon as the underlying substrate, which advantages include the substantial identity of the thermal coefficient of the underlying substrate with that of the epitaxial layer. Where a SIS is fabricated with a polycrystalline supporting substrate, the thermal coefficient may be of such disparity that substantial warping of the composite wafer could occur during subsequent processing steps.

Another advantage associated with the field assisted bonding method results from the application of lower temperatures during the bonding step whereby outdiffusion and autodoping from the heavily doped parent substrate is reduced and contamination of the epitaxial crystalline layer substantially prevented.

Since the epitaxial layer may be as thin as 1–4 microns, the final thinning and removal process of the parent layer is a critical step. Great care must be taken during the dissolution of the parent layer in the field assisted bonding process so that the etching may be stopped just at the epitaxial layer. Such control is difficult to achieve. What is needed then is a process for fabricating SIS wafers utilizing a controllable thinning process in which the removal of the parent layer and the exposure of the epitaxial layer can be immediately and accurately detected and controlled.

BRIEF SUMMARY OF THE INVENTION

The present invention is a process that begins with two substrates, the parent substrate and the supporting substrate. Both the parent and supporting substrates are of a monocrystalline semiconductor material. A semiconductor epitaxial monocrystalline layer is grown upon the surface of the parent substrate. The same semiconductor material is used for the parent and supporting substrates and the epitaxial layer. More particularly, the parent substrate may be a heavily doped silicon substrate upon which an epitaxial silicon layer is grown to the thickness of about 1–4 microns. A thin thermal oxide layer is then formed on the epitaxial layer. In particular the oxide may be a thin layer of thermally grown silicon oxide. Likewise, a similar oxide layer is grown on the surfaces of the supporting substrate. The oxide layer on the supporting substrate and the oxide layer on the epitaxial layer are then placed in contact with each other such that a sandwich is formed consisting of the supporting substrate followed by its thin oxide layer, the thin oxide layer on the epitaxial layer, the thin epitaxial monocrystalline layer, and finally the parent monocrystalline substrate. The two oxide layers are then bonded together utilizing a combination of heat and electrostatic pressure by a process well known in the art as the field assisted bonding method. In another embodiment of the present invention it has been discovered that satisfactory bonding can be achieved without the use of electrostatic pressure and without increasing the temperature. After the oxide layers are bonded the parent substrate is mechanically lapped to a thickness within about 2 mils of the double oxide layer.

After mechanically lapping the parent substrate, the sandwich is subjected to a preferential etch. Typical preferential etching techniques are discussed in other methods in the article by H. Muraoka, et al., "Controlled Preferential Etching Technology", 120 J. Elec. Chem. Soc. C-96 (March 1973). More particularly, the etchant is a 1:3:8 volumetric ratio of hydroflouric (49%), nitric (70%), and acetic (99%) acids respectively. This etchant has an etching rate in the range of 0.7 to 3.0 microns/min. for heavily doped silicon having a resistivity of about $1.0 \times 10^{-2}$ ohm-cm, and, if properly applied, is substantially ineffective on lightly doped silicon having a resistivity in excess of about $6.8 \times 10^{-2}$ ohm-cm. Thus, by proper use of this etchant and heavy doping of the parent substrate, as SIS wafer may be fabricated. One way to maintain the desired etching characteristics of this etchant is to titrate hydrogen peroxide into the etching solution while monitoring the voltage created across a platinum and carbon electrode pair immersed in the etching solution. The platinum anode begins with a positive potential and, in the presence of an oxidizing agent, substantially drops rapidly to a negative potential (becomes the cathode). As long as the platinum electrode is maintained at a negative potential with respect to the carbon electrode, the preferential etching characteristics of the etchant are preserved. The desired potential is achieved by periodically adding drops of an oxidizing agent, such as hydrogen peroxide.

The rate of change of the potential across the electrode pair is dependent on the etching rate, so that when the interface between the heavily doped parent substrate and lightly doped epitaxial layer is reached, a sudden change in the potential versus time can be observed. By this means the etching process may be stopped. However, this alone may be insufficient since certain circuit design restraints may require the thickness of the epitaxial layer to be controlled to within ± 0.1 micron.

Therefore, according to one embodiment of the present invention a visual observation is used to terminate the etch after the drop in potential indicates ethcing through the substrate-epitaxial interface. When the etchant first breaks through the interface only small disconnected islands of epitaxial material are exposed through the remaining parent substrate. As the islands enlarge and connect with each other an expanding observable color change can be seen, namely, a transition from a metallic color to one with a pink hue. Because the lightly doped epitaxial layer is etched at a rate which may be several thousand times slower than that of the heavily doped parent layer, the unevenness of the epitaxial layer can be kept within the desired tolerances by terminating the etch when the epitaxial layer is first fully exposed as indicated by visual observation. Although the color transition may in many cases be observable with the unaided eye, it is entirely within the scope of the present invention to use any visual aid, such as an optical microscope or automatic optical means such as photocell means, to detect the state of the etching process with even greater accuracy.

The novel features which are believed to be characteristic of the invention, both as to its organization and the method of operation, together with further objects and advantages thereof will be better understood from the following description considered in connection with the accompanying drawings in which a presently preferred embodiment of the invention is illustrated by way of example. It is to be expressly understood, however, that the drawing is for the purpose of illustration and description only, and it is not intended as a definition of the limits of the invention.

BRIEF DESCRIPTION OF THE DRAWINGS

FIGS. 1 A and B are simplified cross sectional illustrations showing the parent and supportive crystalline substrates.

FIGS. 2 A and B are cross sectional views of the parent substrate after a thin epitaxial crystalline layer has been disposed thereon.

FIGS. 3 A and B are cross sectional views of the parent and supportive substrate after a layer of thermally grown oxide has been disposed upon the epitaxial layer and upon the supportive substrate.

FIG. 4 is a cross sectional view illustrating the positioning of the supportive substrate underneath the parent substrate such that the two thermal oxide layers are in contact. The two layers are then bonded by a field assisted bonding process or by fusion and the parent substrate mechanically lapped or otherwise thinned down to line A–A'.

DETAILED DESCRIPTION OF THE INVENTION

Figure 5:
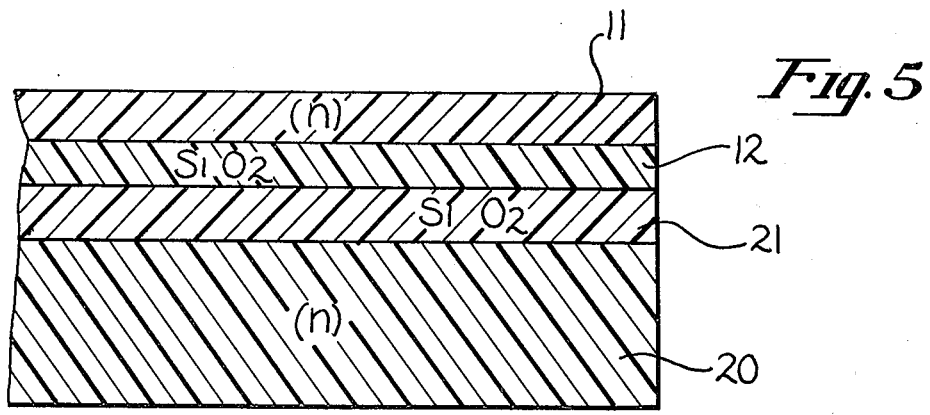
FIG. 5 illustrates the bonded sandwich after the parent substrate has been completely removed by the chemical etching process.

The present invention comprises a method for fabricating monocrystalline epitaxial layers of silicon upon a supportive substrate. The epitaxial layer is grown on a monocrystalline parent substrate which seeds or determines the epitaxial layer's crystallographic structure. An insulative layer is then formed on both the parent and supportive substrates and the two bonded such that the epitaxial layer forms the meat of a sandwich. By a carefully controlled etching process and monitoring thereof the parent substrate is removed leaving an epitaxial layer of silicon of high crystalline perfection and uniformity of thickness disposed upon an insulative layer. The process may be better understood by considering FIGS. 1 through 7.

Referring to FIG. 1 the method of the present invention begins with two semiconductor, monocrystalline substrates. More particularly, the process begins with a parent substrate 10 and a supportive substrate 20. By way of example only, the parent substrate is a heavily doped monocrystalline substrate of silicon with n-type arsenic doping and resistivity between 0.003 – 0.007 ohm-centimeter, or a p-type boron doped silicon substrate with a resistivity of 0.005 – 0.020 ohm-centimeter. The crystallographic orientation of epitaxial layer 11, which shall serve as the active semiconductor layer for subsequently fabricated integrated circuits, is determined by the crystallographic orientation of parent substrate 10. By way of example only, substrate 10 may typically have an orientation of [111] or [100]. The resistivity of supportive substrate 20 may generally be of any magnitude, although it is preferable in some applications to fix the impurity concentration within substrate 20 at a level such that the etching rate of substrate 20 is substantially less than that of substrate 10. For example, in the preferred embodiment supportive substrate 20 may have a resistivity of about 2 ohm-centimeters while present substrate 10 has a resistivity of about 0.01 ohm-centimeter. It may also be preferable to avoid thermal expansion problems in certain instances by having substrate 20 with the same crystallographic orientation as substrate 10, and consequently, the same as epitaxial layer 11.

Referring now to FIG. 2 a thin epitaxial layer 11 of semiconductor material is grown on parent substrate 10. Deposition of the epitaxial layer may be achieved by any of the methods well known to the art, such as vacuum evaporation, cathodic sputtering, vapor decomposition or thermal deposition. By way of example, epitaxial layer 11 may be 3–4 microns thick and may be of any conductivity type, regardless of the conductivity type of parent substrate 10. It is essential in the preferred embodiment of the present invention that the resistivity of epitaxial layer 11 be substantially greater than the resistivity of parent substrate 10. For example, any resistivity greater than 0.068 ohm-centimeter in the epitaxial layer would be sufficient to be within the practice of the present invention.

In FIG. 3 a thermal oxide layer has been grown on the surface of epitaxial layer 11 and supportive substrate 20. In the preferred embodiment layer 12 is an oxide of silicon which may be approximately 0.3 to 0.7 microns thick. Thermal oxidation of epitaxial layer 11 should be effected at a low enough temperature to avoid sufficient out diffusion of impurities contained in parent substrate 10 which might thereby dope epitaxial layer 11. For example, in the preferred embodiment thermal oxidation at not more than about 900° C has been found to be suitable.

FIG. 4 shows the manner in which substrate 20 and its oxide layer 21 should be placed upon thermal oxide layer 12. The thickness of oxide layer 21 is typically about 1.2 microns. The assembled sandwich of layers illustrated in FIG. 4 are then bonded together by a field assisted bonding process, alternatively known as the Mallory Process or by thermal fusion. The field assisted bonding process is well known to the art as a means by which glass to metal seals may be securely made. The process is applicable, however, to any bonding of an insulator to a conductor, and may also be used to affect insulator to insulator bonds.

A field assisted bonding process is based upon the principle that when two materials with highly polished surfaces are placed in contact and heated to sufficient temperature, and when a DC voltage is applied across the interface of the materials, the electrostatic force in conjunction with the heat will result in a bond of high tensile strength. The temperatures and voltage used in each case as well as the polarity of the applied voltage are determined by the nature of the two materials to be bonded. For example, in the case of a glass to metal seal the glass must be maintained at a negative potential with respect to the metal and heated to a temperature close to the annealing point of glass, while a 1000 volt DC drop is applied across the interface.

In the preferred embodiment where the interface consists of layers of the two similar insulators the arrangements of polarity is largely irrelevant. The substrates need be heated only to the approximately 900° C and a DC voltage of approximately 100 volts should be applied across the interface of layer 21 and 12. It is entirely within the scope of the present invention that a voltage need not be applied, but that layers 21 and 12 fuse together by means of heat (900° C) and the pressure of their own intrinsic weight. Once the specified temperatures and voltages have been reached, bonding should occur approximately within one minute. It should be noted that as in the standard field assisted bonding process the surfaces of layers 12 and 21 should be smooth and free of foreign contaminants. It should be noted that it may be possible to eliminate one of the oxide layers 12 or 21 but at this time the use of the two layers is preferred.

The next step in the process of the preferred embodiment is then to mechanically lap or otherwise thin the parent substrate 10 down to a thickness illustrated as A—A' in FIG. 4, which is approximately within two mils of the interface of layers 11 and 12. Lapping of substrate 10 may occur by any means well known to the art which would not introduce significant crystallographic imperfections in epitaxial layer 11.

FIG. 5 illustrates the bonded SIS type wafer after it has been subjected to the next step in the present invention where the remaining portion of parent layer 10 is removed by a chemical etchant. Due to the extreme thinness of layer 11 it is very important to be able to stop the etching process just as the etchant removes the last portion of substrate 10 from epitaxial layer 11. The preferred embodiment of the present invention allows this type of sensitive control over the etching process by using a slow etch in which the rate of production of a chemical byproduct of the etching process is carefully monitored by electrical means. When the etchant reaches epitaxial layer 11, in accordance with the teachings of the present invention, the etchant encounters a semiconductor material of substantially different doping concentration. The rate of etching is dependent upon the impurity concentrations within the material being etched. The exposure of the interface of substrate 10 and layer 11 is immediately reflected in a substantial change in the rate of buildup of one of the byproducts of the etching process. In particular, the etching solution may be a mixture of solutions of hydroflouric (49% by weight), nitric (70% by weight) and acetic acids (99.5% by weight) combined in the volumetric ratio of 1:3:8 respectively. Although the dynamics of the chemical reaction are not perfectly understood, it has been reported that the etchant preferentially etches heavily doped silicon ( $1.0 \times 10^{-2}$ ohm-cm) at the rate of 0.7 to 3 microns per minute while etching lightly doped silicon ($>6.8 \times 10^{-2}$ ohm-cm) at an insubstantial rate as long as the concentration of nitrous acid is kept low. Small amounts of nitrous acid naturally present in the nitric acid solution oxidize the silicon to form as one byproduct, nitrogen oxide. The nitrogen oxide in turns reacts with other naturally occurring components in nitric acid to produce more nitrous acid in a fast, self-catalytic reaction. Therefore, nitrous acid, which is an active oxidizing agent of lightly doped silicon, tends to increase rapidly in the nitric acid solution. The concentration of nitrous acid can be suppressed by the addition of an oxidizing agent to the nitric acid solution, such as hydrogen peroxide. The etchant can then be maintained in a state where heavily doped silicon is preferentially etched relative to lightly doped silicon. In order to insure the maintenance of proper nitrous acid levels, hydrogen peroxide must be added in a controlled fashion over time. This is accomplished by monitoring the electromotive force (emf) created between a platinum and carbon electrode pair immersed in the solution. If the platinum electrode is negative with respect to the carbon electrode, the nitrous acid concentration is within the range wherein the etchant exhibits the desired preferential etching characteristics. A drift towards a positive emf can be averted by titration of hydrogen peroxide. It should be noted that the use of emf to monitor and detect the removal of parent layer 10 is particularly adaptable to electronically controlled batch processing on a large scale.

Since the etching rate of parent layer 10 and epitaxial layer 11 is of the order of three magnitudes apart, the etching appears to abruptly stop after "puncturing" through the parent-epitaxial interface. Local spots of "puncture" appear across the interface, grow and eventually merge together indicating complete removal of parent layer 10. In addition, the emf between the electrode pair changes much less rapidly, indicating the beginning of "puncture". By visual observation, either by the aided, by the naked eye or by both, the event of "puncturing through" can be observed as a change of color from a specular, metallic sheen to a pinkish hue. After the indication by emf and visual observation, the substrate is removed from the etchant and the etching process terminated. It has been found that the thickness of epitaxial layer 11 can be kept uniform to within ± 0.1 micron, and made as thin as 1 micron by the present invention.

Figure 6:
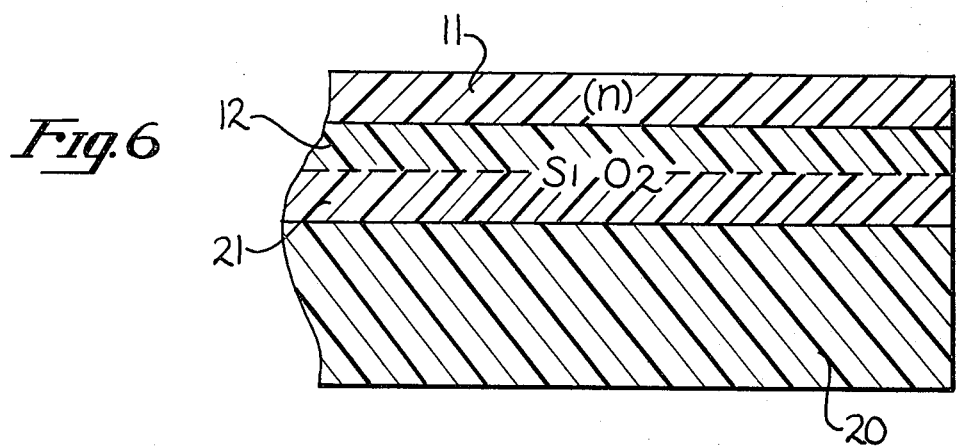
FIG. 6 is a cross sectional view of the finished SIS wafer fabricated by the method of the present invention after one or more finishing and thinning etches have been applied to the epitaxial layer.

Referring now to FIG. 6 the SIS wafer now consists of a crystalline substrate 20 supporting a double oxide layer 21 and 12 upon which a thin epitaxial layer, having the same crystallographic orientation as supporting layer 20 is disposed. The surface of epitaxial layer 11 is subjected to a final etch, which by way of example only, may consist of 50 milliliters of a 48% volumetric aqueous solution of hydroflouric acid and 50 milliliters of a 90% volumetric aqueous solution of acetic acid in which 200 milligrams of potassium permanganate have been added. This etchant may be used to thin epitaxial layer 11 to its final desired thickness and to remove any stain films which are formed.

Figure 7:
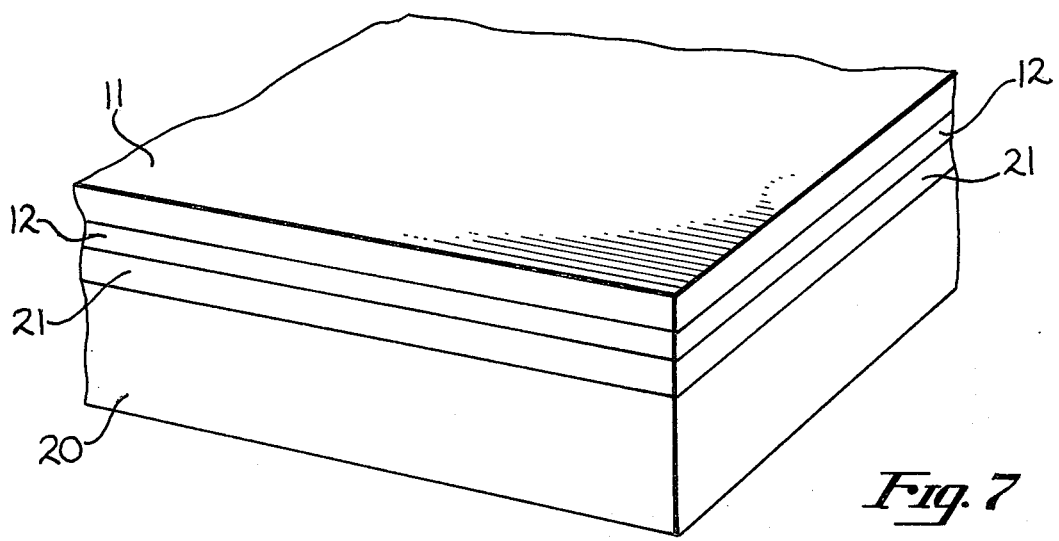
FIG. 7 is a perspective view of the finished SIS wafer fabricated according to the method of the present invention.

FIG. 7 illustrates the final product fabricated by the process of the preferred embodiment and consists of a single silicon crystal 20 supporting a layer of silicon oxide composed of two sublayers 21 and 12 which together may have a combined thickness of approximately 1–2 microns, which passivating layer in turn supports and is bonded to a single doped crystal of epitaxial silicon having the same crystallographic orientation as the underlying supportive substrate 20. The thickness of epitaxial layer 11 may typically be 4 microns or less.

It is entirely within the scope and spirit of the present invention that modifications may be made by those with ordinary skills in the art.

I claim:

1. A method for fabricating a semiconductor wafer comprising:
   starting with a silicon monocrystalline, parent substrate;
   forming an epitaxial, silicon, monocrystalline layer upon said parent substrate, said epitaxial layer having substantially different doping concentrations than said parent substrate;
   forming an insulating layer on said parent substrate with epitaxial layer and on a silicon, supportive substrate;
   bonding said parent and supportive substrates whereby said insulating layers on said parent and supportive substrates are in physical contact and whereby said epitaxial layer is positioned between said parent and supportive substrates;
   lapping a portion of said parent substrate;
   etching said parent substrate by a preferential chemical etchant;
   measuring an electromotive force between an electrode pair immersed in said chemical etchant; and
   adding an oxidizing agent to said etchant in response to said measuring of electromotive force to control the etching characteristics of said etchant and to terminate said etching when removal is substantially complete.

2. The method of claim 1 wherein:
   said supportive substrate has substantially the same crystallographic orientation as said epitaxial layer;
   said bonding of said insulating layers is by combined application of heat and electrostatic pressure;
   said etching of said parent layer is by a mixture of hydroflouric, nitric and acetic acids.

3. The method of claim 1 wherein: said parent substrate has a resistivity less than 0.02 ohm-cm; and said epitaxial layer has a resistivity greater than 0.068 ohm-cm.

4. A method in accordance with claim 1 wherein:
   said etching solution is a mixture of 49 percent by weight hydroflouric acid, 70 percent by weight nitric acid, and 99.5 percent by weight acetic acid, in substantially the volumetric ratios of 1:3:8 respectively.

5. The method of claim 4 wherein:
   said oxidizing agent is hydrogen peroxide; and
   said electrode pair has one electrode of platinum and another of carbon.

\* \* \* \* \*